(12) United States Patent
Toyoshima et al.

(10) Patent No.: US 10,175,831 B2
(45) Date of Patent: *Jan. 8, 2019

(54) DISPLAY DEVICE WITH A CAPACITIVE TOUCH PANEL

(71) Applicant: ZEON CORPORATION, Tokyo (JP)

(72) Inventors: Tetsuya Toyoshima, Tokyo (JP); Shunsuke Yamanaka, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/891,220

(22) PCT Filed: Apr. 9, 2014

(86) PCT No.: PCT/JP2014/002046
§ 371 (c)(1),
(2) Date: Nov. 13, 2015

(87) PCT Pub. No.: WO2014/185000
PCT Pub. Date: Nov. 20, 2014

(65) Prior Publication Data
US 2016/0092005 A1    Mar. 31, 2016

(30) Foreign Application Priority Data

May 16, 2013    (JP) .................................. 2013-104304

(51) Int. Cl.
*G06F 3/044*    (2006.01)
*H01L 27/32*    (2006.01)
(Continued)

(52) U.S. Cl.
CPC .............. *G06F 3/044* (2013.01); *B32B 27/06* (2013.01); *B32B 27/325* (2013.01); *B32B 27/36* (2013.01);
(Continued)

(58) Field of Classification Search
CPC ...... G06F 3/044; G06F 3/0416; G06F 3/0412; G06F 3/041
See application file for complete search history.

(56) References Cited

U.S. PATENT DOCUMENTS 6,822,711 B1    11/2004    Yoshida et al.
9,377,571 B2    6/2016    Jeon et al.
(Continued)

FOREIGN PATENT DOCUMENTS

CN    1304056 A    7/2001
CN    1629684 A    6/2005
(Continued)

OTHER PUBLICATIONS

May 27, 2014 Search Report issued in International Patent Application No. PCT/JP2014/002046.

*Primary Examiner* — Olga Merkoulova
(74) *Attorney, Agent, or Firm* — Oliff PLC

(57) ABSTRACT

Disclosed is a display device with a capacitive touch panel including a laminate between a display panel and a cover layer, the laminate having a viewing-side polarizing plate, a first conductive layer, a second conductive layer, and a substrate, in which the substrate has an optical film with a phase difference of $(2n-1)\lambda/4$, where n is a positive integer, the viewing-side polarizing plate has a polarizing film, and a slow axis of the optical film intersects a transmission axis of the polarizing film at an angle of about 45° as viewed in the stacking direction.

17 Claims, 4 Drawing Sheets

(51) Int. Cl.
*H01L 51/52* (2006.01)
*G02F 1/13363* (2006.01)
*B32B 27/06* (2006.01)
*B32B 27/32* (2006.01)
*B32B 27/36* (2006.01)
*G06F 3/041* (2006.01)
*H05K 1/02* (2006.01)
*H05K 1/09* (2006.01)
*G02B 5/30* (2006.01)
*G02F 1/1335* (2006.01)

(52) U.S. Cl.
CPC ........ *B32B 27/365* (2013.01); *G02F 1/13363* (2013.01); *G06F 3/0412* (2013.01); *H01L 27/323* (2013.01); *H01L 51/5281* (2013.01); *H05K 1/0274* (2013.01); *H05K 1/0296* (2013.01); *H05K 1/09* (2013.01); *B32B 2307/202* (2013.01); *B32B 2307/42* (2013.01); *B32B 2457/20* (2013.01); *G02B 5/3025* (2013.01); *G02F 2001/133562* (2013.01); *G02F 2001/133635* (2013.01); *G02F 2001/133638* (2013.01); *G02F 2413/01* (2013.01); *G02F 2413/08* (2013.01); *G06F 2203/04103* (2013.01)

(56) References Cited

U.S. PATENT DOCUMENTS

| | | |
|---|---|---|
| 2002/0008840 A1 | 1/2002 | Sakamaki et al. |
| 2004/0017364 A1* | 1/2004 | Tanaka ................ G02F 1/13338 345/173 |
| 2005/0134771 A1 | 6/2005 | Kim et al. |
| 2006/0177607 A1 | 8/2006 | Ohmori et al. |
| 2009/0015761 A1* | 1/2009 | Stockham ............. G06F 3/0412 349/96 |
| 2010/0233930 A1* | 9/2010 | Ishida .................. G06F 3/0412 445/24 |
| 2011/0026120 A1* | 2/2011 | Suzuki .................... G02B 1/111 359/580 |
| 2011/0291966 A1 | 12/2011 | Takao et al. |
| 2012/0288672 A1* | 11/2012 | Ogilvie ............... B29C 65/4895 428/141 |
| 2013/0016047 A1 | 1/2013 | Masumoto |
| 2013/0092425 A1 | 4/2013 | Yamasaki et al. |
| 2013/0169593 A1 | 7/2013 | Imamura et al. |
| 2013/0222282 A1* | 8/2013 | Huang ................... G06F 3/044 345/173 |
| 2013/0258570 A1 | 10/2013 | Nashiki et al. |
| 2014/0247487 A1* | 9/2014 | Jeon ..................... G02B 5/3083 359/489.07 |
| 2014/0354304 A1 | 12/2014 | Omote et al. |
| 2015/0029412 A1 | 1/2015 | Kishioka et al. |
| 2016/0070382 A1* | 3/2016 | Toyoshima ............. G06F 3/044 349/12 |
| 2016/0070383 A1* | 3/2016 | Toyoshima ........... H01L 27/323 345/174 |

FOREIGN PATENT DOCUMENTS

| | | |
|---|---|---|
| CN | 1818723 A | 8/2006 |
| CN | 103092452 A | 5/2013 |
| JP | S50-83482 A | 7/1975 |
| JP | H02-113920 A | 4/1990 |
| JP | H03-182701 A | 8/1991 |
| JP | 2000-009912 A | 1/2000 |
| JP | 2001-147777 A | 5/2001 |
| JP | 2002-022944 A | 1/2002 |
| JP | 2002-086554 A | 3/2002 |
| JP | 2002-311239 A | 10/2002 |
| JP | 2004-198614 A | 7/2004 |
| JP | 2007-156121 A | 6/2007 |
| JP | 2009-169837 A | 7/2009 |
| JP | 2009-283349 A | 12/2009 |
| JP | 2010-039458 A | 2/2010 |
| JP | 2011248722 A | 12/2011 |
| JP | 2012033135 A | 2/2012 |
| JP | 2012-206343 A | 10/2012 |
| JP | 2013-003952 A | 1/2013 |
| JP | 2013-041566 A | 2/2013 |
| JP | 2013-089007 A | 5/2013 |
| KR | 2013-0016135 A | 2/2013 |
| WO | 2012/073964 A1 | 6/2012 |
| WO | 2012073990 A1 | 6/2012 |
| WO | 2012/165184 A1 | 12/2012 |
| WO | 2013/099691 A1 | 7/2013 |

* cited by examiner

DISPLAY DEVICE WITH A CAPACITIVE TOUCH PANEL

TECHNICAL FIELD

This disclosure relates to a display device with a touch panel, in particular to a display device with a capacitive touch panel.

BACKGROUND

As displays combined with input means, display devices with touch panels are widely used in electronics, such as laptop computers, OA equipment, medical equipment, car navigation devices, portable electronic devices such as mobile phones, and personal digital assistants (PDAs).

Here, different types of touch panels are known, including capacitive type, optical type, ultrasonic type, electromagnetic induction type, resistance film type, and the like. Among these, in particular, capacitive type, which detects input coordinates by monitoring changes in the electrostatic capacity between a finger tip and a conductive layer, is becoming the mainstream of current touch panels, on par with resistance film type.

As a conventional display device with a capacitive touch panel, for example, a liquid crystal display device is known to have: a backlight-side polarizing plate; a liquid crystal panel formed with a liquid crystal layer sandwiched between two glass base plates (a thin film transistor base plate and a color filter base plate); a viewing-side polarizing plate; a touch sensor unit; and a cover glass layer, which are stacked in the stated order from the backlight side towards the viewing side. Additionally, the above conventional liquid crystal display device with a capacitive touch panel may have a phase difference film for viewing angle compensation provided between the liquid crystal panel and the viewing-side polarizing plate.

In addition, a conventional liquid crystal display device with a touch panel proposes providing a quarter wavelength plate between a viewing-side polarizing plate and a cover glass layer such that linearly polarized light traveling from the liquid crystal panel side through the viewing-side polarizing plate towards the cover glass layer side is converted by the quarter wavelength plate into circularly polarized light or elliptically polarized light (see, for example, JP2009-169837A (PTL 1)). In this way, when a liquid crystal display device with a touch panel is operated by an individual wearing polarized sunglasses, the displayed content can be visually recognized even under the condition of so-called crossed nicols, in which a transmission axis of the viewing-side polarizing plate and a transmission axis of the polarized sunglasses are set orthogonal to each other.

Moreover, as another conventional display device with a capacitive touch panel, an organic EL display device is known to have: a display panel formed by an organic EL display (OLED) panel and a barrier glass layer which is positioned closer to the viewing side than is the OLED panel; an anti-reflective circularly polarizing plate formed by a quarter wavelength plate and a polarizing plate which is positioned closer to the viewing side than is the quarter wavelength plate; a touch sensor unit; and a cover glass layer, which are stacked in the stated order from the display panel side (light emitting side) towards the viewing side (see, for example, JP2013-41566A (PTL 2)). Such an organic EL display device can prevent incident external light (natural light) being reflected at the surface of the OLED panel (particularly the surface of an electrode in the OLED panel) from making visual recognition of the displayed content difficult.

Additionally, any of the above conventional display devices with capacitive touch panels has a touch sensor unit that is formed with, for example, two transparent base plates, each having a conductive layer formed on a surface thereof, stacked together such that the conductive layer of one transparent base plate face a surface of the other transparent base plate on the side opposite where the conductive layer of the other transparent base plate is formed (see, for example, JP2013-3952A (PTL 3)).

CITATION LIST

Patent Literature

PTL 1: JP2009-169837A
PTL 2: JP2013-41566A
PTL 3: JP2013-3952A

SUMMARY

Technical Problem

Recently, there is increasing demand for further reduction in the thickness and weight of display devices with capacitive touch panels. However, the above conventional display devices with capacitive touch panels have the problem that since a touch sensor unit is formed with two transparent base plates, each having a conductive layer formed on a surface thereof, the thickness between the liquid crystal panel or OLED panel and the cover glass layer increases, which results in an increase in the thickness of the entire device.

The problem of increased thickness between the liquid crystal panel or OLED panel and the cover glass layer becomes more pronounced, particularly in the case of many members being present between the display panel and the cover glass layer, such as where, as described above, a phase difference film for viewing angle compensation is provided, a quarter wavelength plate is provided to enable the operator to operate the display device with a tough panel through polarized sunglasses, an anti-reflective circularly polarizing plate is provided, and so on.

Therefore, a first object of the disclosure is to provide a display device with a capacitive touch panel that is reduced in thickness.

In addition, a second object of the disclosure is to provide a display device with a capacitive touch panel that can be operated by the operator even through polarized sunglasses and is reduced in thickness.

Moreover, a third object of the disclosure is to provide a display device with a capacitive touch panel that can prevent reflected light of incident external light from making visual recognition of the displayed content difficult, and that is reduced in thickness.

Solution to Problem

To solve the above problem, intense study was made and the study gave an idea of forming conductive layers on both surfaces of an optical member that is used in a display device with a capacitive touch panel for imparting a phase difference to light, such as a phase difference film, a quarter wavelength plate, or a circularly polarizing plate, to eliminate the need for transparent base plates for forming the conductive layers, thereby reducing the thickness of the display device with a capacitive touch panel.

To solve the aforementioned problem advantageously, according to a first aspect of the disclosure, there is provided a display device with a capacitive touch panel comprising a laminate between a display panel and a cover layer, the laminate having a viewing-side polarizing plate, a first conductive layer, a second conductive layer, and a substrate, wherein the first conductive layer, the second conductive layer, and the substrate are positioned closer to the cover layer than is the viewing-side polarizing plate, and the first conductive layer is positioned closer to the cover layer than is the second conductive layer, the first conductive layer and the second conductive layer are arranged apart from each other in a stacking direction so as to form a capacitive touch sensor, the first conductive layer is formed on a surface of the substrate on the side of the cover layer, the second conductive layer is formed on a surface of the substrate on the side of the display panel, the substrate has an optical film with a phase difference of $(2n-1)\lambda/4$, where n is a positive integer, the viewing-side polarizing plate has a polarizing film, and a slow axis of the optical film intersects a transmission axis of the polarizing film at an angle of about 45° as viewed in the stacking direction. In this way, by providing the substrate closer to the cover layer than is the viewing-side polarizing plate, the substrate having the optical film for imparting a predetermined phase difference to light, and by setting the angle at which the slow axis of the optical film and the transmission axis of the polarizing film intersect to about 45°, the display device with a touch panel can be operated by the operator even through polarized sunglasses. In addition, when the first conductive layer and the second conductive layer are both formed on the substrate, it is possible to reduce transparent base plates for forming the conductive layers and simplify the structure of the touch sensor, thereby reducing the thickness between the display panel and the cover layer.

In the first aspect, "about 45°" covers angles of, for example, 45°±10°, at which linearly polarized light traveling from the display panel side through the viewing-side polarizing plate towards the cover layer side can be converted by the optical film of the substrate into circularly polarized light or elliptically polarized light to enable operation through polarized sunglasses.

To solve the aforementioned problem advantageously, according to a second aspect of the disclosure, there is provided a display device with a capacitive touch panel comprising a laminate between a display panel and a cover layer, the laminate having a viewing-side polarizing plate, a first conductive layer, a second conductive layer, and a display panel-side substrate, wherein the first conductive layer, the second conductive layer, and the display panel-side substrate are positioned closer to the display panel than is the viewing-side polarizing plate, and the first conductive layer is positioned closer to the cover layer than is the second conductive layer, the first conductive layer and the second conductive layer are arranged apart from each other in a stacking direction so as to form a capacitive touch sensor, the first conductive layer is formed on a surface of the display panel-side substrate on the side of the cover layer, and the second conductive layer is formed on a surface of the display panel-side substrate on the side of the display panel. In this way, when the first conductive layer and the second conductive layer are both formed on the display panel-side substrate, it is possible to reduce transparent base plates for forming conductive layers and simplify the structure of the touch sensor, thereby reducing the thickness between the display panel and the cover layer.

Here, in the display device with a capacitive touch sensor according to the second aspect, it is preferred (i) the display device further comprises an optical film with a phase difference of $(2n-1)\lambda/4$, where n is a positive integer, between the cover layer and the viewing-side polarizing plate, the viewing-side polarizing plate has a polarizing film, and a slow axis of the optical film intersects a transmission axis of the polarizing film at an angle of about 45° as viewed in the stacking direction, and/or (ii) the display panel-side substrate has a phase difference film for optical compensation. In this way, by providing the optical film for imparting a predetermined phase difference to light closer to the cover layer than is the viewing-side polarizing plate, and by setting the angle at which the slow axis of the optical film and the transmission axis of the polarizing film intersect to about 45°, the display device with a touch panel can be operated by the operator even through polarized sunglasses. In addition, when the display panel-side substrate having the phase difference film for optical compensation is provided closer to the display panel than is the viewing-side polarizing plate, it is possible to compensate for viewing angle dependence, a light leakage phenomenon occurring at the polarizing plate at the time of oblique angle viewing, and the like.

In the second aspect, "about 45°" covers angles of, for example, 45°±10°, at which linearly polarized light traveling from the display panel side through the viewing-side polarizing plate towards the cover layer side can be converted by the optical film into circularly polarized light or elliptically polarized light to enable operation through polarized sunglasses.

In the first and second aspects, it is also preferred that the display panel is a liquid crystal panel.

To solve the aforementioned problem advantageously, according to a third aspect of the disclosure, there is provided a display device with a capacitive touch panel comprising a laminate between a display panel and a cover layer, the laminate having a circularly polarizing plate, a first conductive layer, and a second conductive layer, wherein the circularly polarizing plate comprises a substrate and a polarizing plate, the first conductive layer, the second conductive layer, and the substrate are positioned closer to the display panel than is the polarizing plate, and the first conductive layer is positioned closer to the cover layer than is the second conductive layer, the first conductive layer and the second conductive layer are arranged apart from each other in a stacking direction so as to form a capacitive touch sensor, the first conductive layer is formed on a surface of the substrate on the side of the cover layer, the second conductive layer is formed on a surface of the substrate on the side of the display panel, the substrate has an optical film with a phase difference of $\lambda/4$, and the polarizing plate has a polarizing film. In this way, when the circularly polarizing plate comprising, at a position closer to the display panel than is the polarizing plate, the substrate having the optical film for imparting a phase difference of $\lambda/4$ to light is provided between the display panel and the cover layer, it is possible to prevent reflected light of incident external light from making visual recognition of the displayed content difficult. In addition, when the first conductive layer and the second conductive layer are both formed on the substrate, transparent base plates are no longer needed for forming the conductive layers, and it is thus possible to simplify the structure of the touch sensor, thereby reducing the thickness between the display panel and the cover layer.

As used herein, the "circularly polarizing plate" refers to a member that is capable of converting light incident from the cover layer side towards the display panel side into linearly polarized light, then converting the linearly polarized light into circularly polarized light, and further converting reverse circularly polarized light resulting from the circularly polarized light reflected at the display panel, into another linearly polarized light orthogonal to the linearly polarized light, to thereby prevent transmission of the reflected light into the cover layer side, and that comprises at least: a polarizing plate; and an optical film with a phase difference of λ/4 arranged closer to the display panel than is the polarizing plate. Specifically, examples of the "circularly polarizing plate" include: one having a polarizing plate formed with a polarizing film and an optical film with a phase difference of λ/4 sequentially stacked in a manner such that a slow axis of the optical film intersects a transmission axis of the polarizing film at a predetermined angle; and one having, as described later, a polarizing plate formed with a polarizing film, an optical film with a phase difference of λ/2, and an optical film with a phase difference of λ/4 sequentially stacked in a manner such that respective slow axes of the optical films intersect a transmission axis of the polarizing film at a predetermined angle. It is noted that the polarizing plate and optical films constituting the polarizing plate may be arranged apart from each other in the stacking direction, or another member may be interposed between the polarizing plate and the optical films, or alternatively, between the optical films.

In the third aspect, it is also preferred that as viewed in the stacking direction, the slow axis of the optical film intersects the transmission axis of the polarizing film at an angle of about 45°. By setting the angle at which the slow axis of the optical film and the transmission axis of the polarizing film intersect to about 45°, and by forming a circularly polarizing plate with the use of the polarizing plate and the optical film with a phase difference of λ/4, it is possible to prevent reflected light of incident external light from making visual recognition of the displayed content difficult.

In the third aspect, "about 45°" covers angles of, for example, 45°±5°, at which it is possible to prevent reflected light of incident external light from making visual recognition of the displayed content difficult.

Moreover, in the third aspect, the optical film preferably has reverse wavelength dispersion characteristics. In this way, the phase difference imparted to light incident on the optical film increases in absolute value with increasing wavelength of the light and decreases in absolute value with decreasing wavelength of the light, and therefore desirable polarization characteristics can be obtained over a wide wavelength range, which makes it possible to convert linearly polarized light into circularly polarized light in a favorable manner.

In addition, in the display device with a capacitive touch panel according to the third aspect, it is preferred that the circularly polarizing plate further comprises a polarizing plate-side substrate positioned between the substrate and the polarizing plate, the polarizing film is positioned at a surface of the polarizing plate on the side of the display panel, the polarizing plate-side substrate is bonded to a surface of the polarizing film on the side of the display panel, a slow axis of the optical film intersects a transmission axis of the polarizing film at an angle of about 75° as viewed in the stacking direction, the polarizing plate-side substrate has another optical film with a phase difference of λ/2, and a slow axis of said another optical film intersects the transmission axis of the polarizing film at an angle of about 15° as viewed in the stacking direction. By setting the angle at which the slow axis of the optical film and the transmission axis of the polarizing film intersect to about 75°, and the angle at which the slow axis of said another optical film and the transmission axis of the polarizing film intersect to about 15°, it is possible to form a so-called wideband quarter wavelength plate by using the optical film and said another optical film, to yield desired polarization characteristics in a wide wavelength range, and to convert linearly polarized light into circularly polarized light favorably. Therefore, it is possible to prevent reflected light of incident external light from making visual recognition of the displayed content difficult. In addition, when the polarizing film is positioned at the surface of the polarizing plate on the side of the display panel and the polarizing plate-side substrate is bonded to the surface of the polarizing film on the side of the display panel, it is possible to use the polarizing plate-side substrate as a protective film for the polarizing film. As a result, the display panel-side protective film of the polarizing plate is no longer needed, and the thickness of the polarizing plate can be reduced.

In the third aspect, "about 75°" and "about 15°" cover angles of, for example, "75°±5°" and "15°±5°", respectively, at which it is possible to form a wideband quarter wavelength plate to prevent reflected light of incident external light from making visual recognition of the displayed content difficult. Additionally, "about 75°" and "about 15°" represent angles measured in the same direction with respect to the transmission axis of the polarizing film.

Moreover, in the display device with a capacitive touch panel according to the third aspect, it is preferred that the circularly polarizing plate further comprises a polarizing plate-side substrate positioned between the substrate and the polarizing plate, the polarizing film is positioned at a surface of the polarizing plate on the side of the display panel, the polarizing plate-side substrate is bonded to a surface of the polarizing film on the side of the display panel, a slow axis of the optical film intersects a transmission axis of the polarizing film at an angle of about 90° as viewed in the stacking direction, the polarizing plate-side substrate has another optical film with a phase difference of λ/2, and a slow axis of said another optical film intersects the transmission axis of the polarizing film at an angle of about 22.5° as viewed in the stacking direction. By setting the angle at which the slow axis of the optical film and the transmission axis of the polarizing film intersect to about 90°, and the angle at which the slow axis of said another optical film and the transmission axis of the polarizing film intersect to about 22.5°, it is possible to form a so-called wideband quarter wavelength plate by using the optical film and said another optical film, to yield desired polarization characteristics in a wide wavelength range, and to convert linearly polarized light into circularly polarized light favorably. Therefore, it is possible to prevent reflected light of incident external light from making visual recognition of the displayed content difficult. In addition, when the polarizing film is positioned at the surface of the polarizing plate on the side of the display panel and the polarizing plate-side substrate is bonded to the surface of the polarizing film on the side of the display panel, it is possible to use the polarizing plate-side substrate as a protective film for the polarizing film. As a result, the display panel-side protective film of the polarizing plate is no longer needed, and the thickness of the polarizing plate can be reduced.

In the third aspect, "about 90°" and "about 22.5°" cover angles of, for example, "90°±5°" and "22.5°±5°", respectively, at which it is possible to form a wideband quarter wavelength plate to prevent reflected light of incident external light from making visual recognition of the displayed content difficult. Additionally, "about 90°" and "about 22.5°" represent angles measured in the same direction with respect to the transmission axis of the polarizing film.

Moreover, in the third aspect, the display panel preferably comprises an organic EL display panel.

Additionally, in the display device with a capacitive touch panel according to the first to third aspects, it is preferred that the optical film, the phase difference film, and/or said another optical film has a relative permittivity of 2 or more and 5 or less. It is also preferred that the optical film, the phase difference film, and/or said another optical film has a saturated water absorption of 0.01 mass % or less. Moreover, the optical film, the phase difference film, and/or said another optical film is preferably formed from cycloolefin polymer, polycarbonate, polyethylene terephthalate, or triacetyl cellulose, and is more preferably a cycloolefin polymer without a polar group. When the aforementioned optical film, the phase difference film, and/or said another optical film is used in the substrate and/or the polarizing plate-side substrate, a capacitive touch sensor can be formed favorably.

As used herein, the "relative permittivity" may be measured in accordance with ASTM D150. Also, as used herein, the "saturated water absorption" may be measured following ASTM D570.

Additionally, in the display device with a capacitive touch panel according to the first to third aspects, it is preferred that the optical film and/or said another optical film is an obliquely stretched film. When the optical film and/or said another optical film is an obliquely stretched film, a laminate including the polarizing plate and the optical film and/or said another optical film can be produced easily by a roll-to-roll process.

Additionally, in the display device with a capacitive touch panel according to the first to third aspects, it is preferred that the first conductive layer and the second conductive layer are formed by using indium tin oxide, carbon nanotubes, or silver nanowires.

Additionally, in the display device with a capacitive touch panel according to the third aspect, it is preferred that the display device has no index matching layer in the case where the circularly polarizing plate further comprises a polarizing plate-side substrate positioned between the substrate and the polarizing plate. In this way, it is possible to simplify the structure of the touch sensor and reduce the thickness between the display panel and the cover layer.

Advantageous Effect

According to the disclosure, it is possible to provide a display device with a capacitive touch panel that is reduced in thickness.

In particular, according to the disclosure, it is possible to provide a display device with a capacitive touch panel that can be operated even through polarized sunglasses and is reduced in thickness. According to the disclosure, it is also possible to provide a display device with a capacitive touch panel that can prevent reflected light of incident external light from making visual recognition of the displayed content difficult, and that is reduced in thickness.

DETAILED DESCRIPTION

Figure 1:
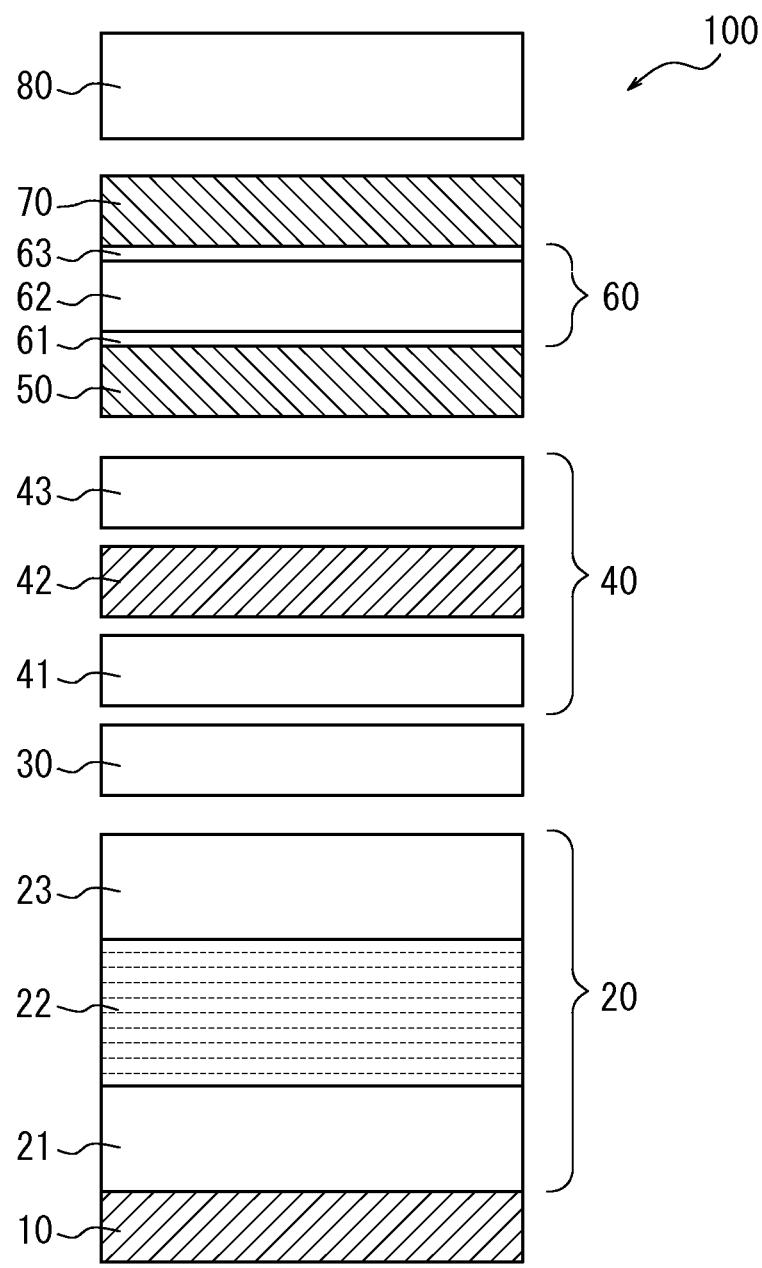
FIG. 1 is a diagram schematically illustrating a cross-sectional structure of the main part of a first display device with a capacitive touch panel according to the disclosure.

Embodiments of the disclosed display device with a capacitive touch panel will be described in detail with reference to the drawings. It is noted that the same reference numerals indicate the same components throughout the drawings. It is also noted that an additional layer or film may also be provided in any space between the members illustrated in the drawings within a range in which the object of the disclosure can be achieved. Here, examples of such additional layers or films include adhesive layers or pressure sensitive adhesive layers that are used to bond members together into a single structure. Preferred adhesive layers or pressure sensitive adhesive layers are transparent to visible light and do not cause any unnecessary phase difference.

Display Device with Capacitive Touch Panel (First Embodiment)

FIG. 1 schematically illustrates a cross-sectional structure of the main part of a first display device with a capacitive touch panel according to the disclosure. It is noted here that the display device with a capacitive touch panel 100 illustrated in FIG. 1 is a device that has both a display function and a touch sensor function, the display function for displaying image information on the screen and the touch sensor function for detecting a position on the screen touched by the operator and outputting it as an information signal to the outside.

The display device with a capacitive touch panel 100 comprises the following members stacked in the stated order from the side from which the backlight is emitted (the lower side of FIG. 1, and this side is hereinafter referred to simply as the "backlight side") towards the side from which the operator views an image (the upper side of FIG. 1, and this side is hereinafter referred to simply as the "viewing side"): a backlight-side polarizing plate 10; a liquid crystal panel as a display panel 20; a phase difference film 30 for optical compensation; a viewing-side polarizing plate 40; a second conductive layer 50; a substrate 60; a first conductive layer 70; and a cover layer 80. Additionally, in the display device with a capacitive touch panel 100, the first conductive layer 70 is formed on one surface of the substrate 60 (on the cover layer 80 side) and the second conductive layer 50 is formed on the other surface of the substrate 60 (on the display panel 20 side).

It is noted that the backlight-side polarizing plate 10, the display panel 20, the phase difference film 30, the viewing-side polarizing plate 40, the substrate 60 formed with the first conductive layer 70 and the second conductive layer 50, and the cover layer 80 may be integrated into a single structure by bonding the members together using known means, such as providing adhesive layers or pressure sensitive adhesive layers, performing plasma treatment on the surfaces of members, and the like. That is, for example, adhesive layers or pressure sensitive adhesive layers are formed in gaps in the layered structure illustrated in FIG. 1.

[Backlight-Side Polarizing Plate]

As the backlight-side polarizing plate 10, a known polarizing plate having a polarizing film, for example, a polarizing plate formed with a polarizing film sandwiched between two protective films may be used. Additionally, the backlight-side polarizing plate 10 is arranged so that a transmission axis of the polarizing film of the backlight-side polarizing plate 10 and a transmission axis of a polarizing film 42 of the viewing-side polarizing plate 40 as detailed below are set orthogonal to each other as viewed in the stacking direction (the vertical direction in FIG. 1), and enables images to be displayed by use of the liquid crystal panel as the display panel 20.

[Display (Liquid Crystal) Panel]

As the liquid crystal panel for use as the display panel 20, it is possible to use a liquid crystal panel formed with a liquid crystal layer sandwiched between two base plates, for example, a liquid crystal panel formed with a liquid crystal layer 22 sandwiched between a thin film transistor base plate 21 positioned on the backlight side and a color filter base plate 23 positioned on the viewing side. Additionally, in the display device with a capacitive touch panel 100, the liquid crystal layer 22 of the liquid crystal panel, which is arranged between the backlight-side polarizing plate 10 and the viewing-side polarizing plate 40, is energized to present a desired image to the operator. It is noted that as the thin film transistor base plate 21 and the color filter base plate 23, known base plates may be used. In addition, as the liquid crystal layer 22, a known liquid crystal layer may be used. It is noted that the display panel 20 which may be used in the display device with a capacitive touch panel disclosed herein is not limited to the liquid crystal panel with the aforementioned structure.

[Phase Difference Film]

The phase difference film 30 is an optical compensation film which compensates for viewing angle dependence of the liquid crystal layer 22, a light leakage phenomenon occurring at the polarizing plates 10, 40 at the time of oblique angle viewing, and the like to thereby improve viewing angle characteristics of the display device with a capacitive touch panel 100.

Additionally, as the phase difference film 30, for example, a known vertical uniaxial stretched film, a known horizontal uniaxial stretched film, a known vertical and horizontal biaxial stretched film, or a phase difference film obtained by polymerizing a liquid crystalline compound may be used. Specifically, the phase difference film 30 is not particularly limited, and examples thereof include a film that is obtained by uniaxially or biaxially stretching a thermoplastic resin film produced by forming a thermoplastic resin such as a cycloolefin polymer into a film by a known method. Additionally, examples of commercially available thermoplastic resin films include "Essina" and "SCA40" (manufactured by Sekisui Chemical Co., Ltd.), "ZEONOR Film" (manufactured by Zeon Corporation), and "ARTON FILM" (manufactured by JSR Corporation), all of which are trade names.

In addition, hard coat layers described below may be formed on both surfaces of the phase difference film 30.

It is noted that the phase difference film 30 may be arranged so that the slow axis of the phase difference film 30 and the transmission axis of the polarizing film of each of the polarizing plates 10, 40 are, for example, parallel or orthogonal to each other as viewed in the stacking direction.

[Viewing-Side Polarizing Plate]

The viewing-side polarizing plate 40 is not particularly limited, and an example thereof may be a polarizing plate 40 that is formed with the polarizing film 42 sandwiched between two protective films (backlight-side protective film 41 and cover layer-side protective film 43).

[Second Conductive Layer]

The second conductive layer 50 is formed on one surface of the substrate 60 (on the display panel 20 side), and is positioned between the viewing-side polarizing plate 40 and the substrate 60, more specifically, between the cover layer-side protective film 43 of the viewing-side polarizing plate 40 and the substrate 60. Additionally, the second conductive layer 50 forms a capacitive touch sensor, in conjunction with the first conductive layer 70 positioned apart in the stacking direction across the substrate 60.

Here, the second conductive layer 50 may be any layer as long as it has transmittance in the visible light region and has conductivity, and may be formed by using any suitable material including, but not particularly limited to, conductive polymers; conductive pastes such as silver paste and polymer paste; metal colloids such as gold and copper; metal oxides such as indium tin oxide (tin-doped indium oxide: ITO), antimony-doped tin oxide (ATO), fluorine-doped tin oxide (FTO), aluminum-doped zinc oxide (AZO), cadmium oxide, cadmium-tin oxide, titanium oxide, and zinc oxide; metal compounds such as copper iodide; metals such as gold (Au), silver (Ag), platinum (Pt), and palladium (Pd); and inorganic or organic nanomaterials such as silver nanowires and carbon nanotubes (CNTs). Among these, indium tin oxide, carbon nanotubes, and silver nanowires are preferred, and particularly preferred is indium tin oxide from a light transmittivity and durability perspective.

It is noted that when CNTs are used, any of single-walled CNTs, double-walled CNTs, triple- or higher order multi-walled CNTs may be used, yet the diameter of the CNTs used is preferably from 0.3 nm to 100 nm and the length thereof is preferably from 0.1 μm to 20 μm. It is noted that from the viewpoint of increasing transparency of conductive layers and reducing the surface resistance, single-walled CNTs or double-walled CNTs of 10 nm or less in diameter and 1 μm to 10 μm in length are preferably used. It is also preferred that the collection of CNTs contain as few impurities as possible, such as amorphous carbon and catalyst metal.

[First Conductive Layer]

The first conductive layer 70 is formed on the other surface of the substrate 60 (on the cover layer 80 side) and is positioned closer to the cover layer 80 than is the second conductive layer 50, more specifically, between the substrate 60 and the cover layer 80. Additionally, the first conductive layer 70 forms a capacitive touch sensor, in conjunction with the second conductive layer 50 positioned apart in the stacking direction across the substrate 60.

Additionally, the first conductive layer 70 may be formed by using the same material as the second conductive layer 50.

Here, the conductive layers 50, 70 constituting the capacitive touch sensor are often formed in a patterned manner. Specifically, the first conductive layer 70 and the second conductive layer 50 constituting the capacitive touch sensor may be formed in a pattern such that they form a rectilinear lattice, a wavy lattice, or a diamond-like lattice when arranged to face each other and viewed in the stacking direction. It is noted that the wavy lattice refers to a shape having at least one curved section between intersections.

Additionally, the formation of the first conductive layer 70 and the second conductive layer 50 on respective surfaces of the substrate 60 is not particularly limited, and may be performed by a sputtering method, a vacuum evaporation method, a CVD method, an ion plating method, a sol-gel method, a coating method, or the like.

It is noted that the thickness of the first conductive layer 70 and of the second conductive layer 50, when formed from ITO, may preferably be, for example, and without limitation, preferably from 10 nm to 150 nm, and more preferably from 15 nm to 70 nm. The surface resistivity of the first conductive layer 70 and of the second conductive layer 50 may be preferably, but is not particularly limited to, 100 Ω/sq to 1000 Ω/sq.

[Substrate with Optical Film]

The substrate 60 formed with the first conductive layer 70 and the second conductive layer 50 has an optical film 62 with a phase difference of $(2n-1)\lambda/4$, where n is a positive integer, and hard coat layers 61, 63 formed on both surfaces of the optical film 62. Additionally, the substrate 60 is positioned between the second conductive layer 50 and the first conductive layer 70, and functions as an insulating layer for the capacitive touch sensor which is formed by the first conductive layer 70 and the second conductive layer 50. It is noted that the optical film 62 of the substrate 60 is arranged so that a slow axis of the optical film 62 and the transmission axis of the polarizing film 42 of the viewing-side polarizing plate 40 intersect at a predetermined angle as viewed in the stacking direction.

In this case, "a predetermined angle" refers to an angle at which linearly polarized light traveling from the side of the liquid crystal panel as the display panel 20 through the viewing-side polarizing plate 40 towards the side of the cover layer 80 can be converted into circularly polarized light or elliptically polarized light to enable the operator to visually recognize the displayed content even through polarized sunglasses. Specifically, the predetermined angle is about 45°, which more specifically covers angles of 45°±10°, preferably 45°±3°, more preferably 45°±1°, and even more preferably 45°±0.3°.

In addition, the phrase "with a phase difference of $(2n-1)\lambda/4$, where n is a positive integer," indicates that the phase difference (retardation Re) to be applied to light transmitted through the optical film 62 in the stacking direction is about $(2n-1)/4$ times the wavelength $\lambda$ of the light, where n is a positive integer, which is preferably 1. Specifically, in the case where the transmitted light has a wavelength range from 400 nm to 700 nm, and when Re is about $(2n-1)/4$ times the wavelength $\lambda$, it is meant that Re is in the range of $(2n-1)\lambda/4\pm65$ nm, preferably in the range of $(2n-1)\lambda/4\pm30$ nm, and more preferably in the range of $(2n-1)\lambda/4\pm10$ nm. It is noted that Re is the retardation in the in-plane direction represented by the equation $Re=(nx-ny)\times d$, where nx is the refractive index in the film plane in the slow axis direction, ny is the refractive index in a direction orthogonal, in the film plane, to the slow axis in the film plane, and d is the thickness of the optical film 62.

As illustrated in FIG. 1, in this example of the display device with a capacitive touch panel 100, the first conductive layer 70 and second conductive layer 50 constituting the capacitive touch sensor are arranged to face each other across the substrate 60 having the optical film 62. Accordingly, if the substrate 60 has a uniform thickness variation, it is possible to maintain a constant distance between the first conductive layer 70 and the second conductive layer 50 and to afford the touch sensor good detection sensitivity.

[[Optical Film]]

As the optical film 62, it is possible to use a film subjected to orientation treatment that is obtained by forming a thermoplastic resin into a film and stretching the film.

Here, a thermoplastic resin may be stretched by any known stretching method, yet a preferred method is oblique stretching. The reason is as described below. Although the optical film 62 needs to be stacked such that the slow axis of the optical film 62 and the transmission axis of the polarizing film 42 of the viewing-side polarizing plate 40 intersect at a predetermined angle, a stretched film subjected to general stretching treatment (vertical stretching treatment or horizontal stretching treatment) has an optical axis oriented in a direction either parallel or orthogonal to the width direction of the film. Accordingly, to stack the general stretched film and the polarizing film one on top of the other at a predetermined angle, the stretched film needs to be cut at an angle into a sheet of material. An obliquely stretched film, however, has an optical axis oriented in a direction inclined at an angle with respect to the width direction of the film. Accordingly, when an obliquely stretched film is used as the optical film 62, a laminate including the viewing-side polarizing plate 40 and the optical film 62 can be produced easily by a roll-to-roll process. It is noted that in the case of producing a laminate including the viewing-side polarizing plate 40 and the optical film 62 by a roll-to-roll process, it suffices to adjust the orientation angle of the obliquely stretched film used as the optical film 62 such that the slow axis of the optical film 62 and the transmission axis of the polarizing film 42 intersect at the aforementioned predetermined angle in the resulting laminate.

Methods for use in the oblique stretching may include those described in JPS50-83482A, JPH2-113920A, JPH3-182701A, JP2000-9912A, JP2002-86554A, JP2002-22944A, and the like. The stretching machine used for oblique stretching is not particularly limited, and a possible stretching machine is a conventionally known tenter-type stretching machine. Although there are different types of tenter-type stretching machines including horizontal uniaxial stretching machines and simultaneous biaxial stretching machines, the stretching machine used is not limited to a particular type, but rather may be selected from a variety of stretching machines as long as it allows for continuous oblique stretching of a long film.

In addition, the temperature at which the thermoplastic resin is subjected to oblique stretching is preferably in the range of Tg−30° C. to Tg+60° C., and more preferably in the range of Tg−10° C. to Tg+50° C., where Tg is the glass-transition temperature of the thermoplastic resin. In addition, the stretching ratio is normally from 1.01 times to 30 times, preferably from 1.01 times to 10 times, and more preferably from 1.01 times to 5 times.

Examples of the thermoplastic resins which can be used to form the optical film 62 include, but are not particularly limited to, cycloolefin polymers, polycarbonate, polyarylate, polyethylene terephthalate, triacetyl cellulose, polysulfone, polyethersulfone, polyphenylene sulfide, polyimide, polyamide imide, polyethylene, polypropylene, polyvinyl chloride, polystyrene, polyolefin, polyvinyl alcohol, and polyvinyl chloride-polymethyl methacrylate. Among these, preferred are cycloolefin polymers, polycarbonate, polyethylene terephthalate, and triacetyl cellulose, more preferred are cycloolefin polymers because of their low relative permittivity, and particularly preferred are cycloolefin polymers without a polar group such as an amino group, a carboxyl group, and a hydroxyl group because of their low relative permittivity and low water absorption.

Examples of cycloolefin polymers may include norbornene-based resins, monocyclic olefin-based resins, cyclic conjugated diene-based resins, vinyl alicyclic hydrocarbon-based resins, and hydrides thereof. Among these, norbornene-based resins are suitably used because of their good transparency and good formability.

Examples of norbornene-based resins may include: a ring-opened polymer of a monomer with norbornene structure, a ring-opened copolymer of a monomer with norbornene structure and another monomer, and hydrides thereof; and an addition polymer of a monomer with norbornene structure, an addition copolymer of a monomer with norbornene structure and another monomer, and hydrides thereof.

Examples of commercially available cycloolefin polymers include "Topas" (manufactured by Ticona GmbH), "ARTON" (manufactured by JSR Corporation), "ZEONOR" and "ZEONEX" (manufactured by Zeon Corporation), "APEL" (manufactured by Mitsui Chemicals, Inc.), all of which are trade names. By forming such a cycloolefin-based resin into a film, the optical film 62 made from a thermoplastic resin can be obtained. For film formation, a known film formation method is appropriately used, such as a solvent casting method and a melt extrusion method. In addition, cycloolefin-based resin films obtained by a film formation method are also commercially available, and examples thereof include "Essina" and "SCA40" (manufactured by Sekisui Chemical Co., Ltd.), "ZEONOR Film" (manufactured by Zeon Corporation), and "ARTON FILM" (manufactured by JSR Corporation), all of which are trade names. A thermoplastic resin film before stretching is generally a long unstretched film. In this context, a "long" film indicates a film having a length of at least about 5 times or more, preferably 10 times or more, the width of the film, and specifically a film having a length long enough for the film to be wound into a roll for storage or transportation.

The aforementioned thermoplastic resin has a glass-transition temperature of preferably 80° C. or higher, and more preferably from 100° C. to 250° C. In addition, the photoelastic coefficient of the thermoplastic resin is, in absolute value, preferably $10 \times 10^{-12}$ $Pa^{-1}$ or less, more preferably $7 \times 10^{-12}$ $Pa^{-1}$ or less, and particularly preferably $4 \times 10^{-12}$ $Pa^{-1}$ or less. Photoelastic coefficient C is a value represented by $C = \Delta n / \sigma$, where $\Delta n$ is birefringence and $\sigma$ is stress. By using a transparent thermoplastic resin whose photoelastic coefficient falls within this range, it is possible to reduce variations in in-plane direction retardation Re of the optical film. Moreover, when such an optical film is applied to a display device using a liquid crystal panel, it is possible to suppress a phenomenon that alters the hue at edges of the display screen of the display device.

It is noted that the thermoplastic resin used to form the optical film 62 may be blended with other compounding agents. The compounding agents are not particularly limited, and examples thereof include layered crystal compounds; inorganic fine particles; stabilizers such as antioxidants, heat stabilizers, light stabilizers, weathering stabilizers, ultraviolet absorbers, and near-infrared absorbers; resin modifiers such as lubricants and plasticizers; coloring agents such as dyes and pigments; and antistatic agents. These compounding agents may be used alone or in combination of two or more, and the blending amount thereof is properly selected within a range not to impair the object of the disclosure.

Examples of antioxidants include phenolic antioxidants, phosphoric antioxidants, and sulfuric antioxidants, and among these preferred are phenolic antioxidants, and particularly preferred are alkyl-substituted phenolic antioxidants. By blending these antioxidants, it is possible to prevent coloring of the film and decrease in strength of the film due to oxidation deterioration during the film formation, without deteriorating transparency, low water absorption properties, and the like. These antioxidants may be used alone or in combination of two or more, and the blending amount thereof is properly selected within a range not to impair the object of the disclosure, yet is normally 0.001 parts by mass to 5 parts by mass, and preferably 0.01 parts by mass to 1 part by mass, per 100 parts by mass of the thermoplastic resin.

Inorganic fine particles that have an average particle size of 0.7 μm to 2.5 μm and a refractive index of 1.45 to 1.55 are preferred. Specific examples thereof include clay, talc, silica, zeolite, and hydrotalcite, and among these preferred are silica, zeolite, and hydrotalcite. The addition amount of inorganic fine particles is not particularly limited, yet is normally 0.001 parts by mass to 10 parts by mass, and preferably 0.005 parts by mass to 5 parts by mass, per 100 parts by mass of the thermoplastic resin.

Examples of lubricants include hydrocarbon-based lubricants; fatty acid-based lubricants; higher alcohol-based lubricants; fatty acid amide-based lubricants; fatty acid ester-based lubricants; and metallic soap-based lubricants. Among these, preferred are hydrocarbon-based lubricants, fatty acid amide-based lubricants, and fatty acid ester-based lubricants. Further, of these preferred lubricants, particularly preferred are those having a melting point of 80° C. to 150° C. and an acid value of 10 mg KOH/mg or lower.

If the melting point is out of the range of 80° C. to 150° C. and in addition the acid value is greater than 10 mg KOH/mg, the haze value can increase.

Additionally, the thickness of the stretched film used as the optical film 62 is, for example, suitably set in the range of approximately 5 μm to 200 μm, and is preferably from 20 μm to 100 μm. If the thickness of the film is excessively small, strength or retardation value can be insufficient, while the thickness is excessively large, transparency can be deteriorated and it can be difficult to obtain a desired retardation value.

In addition, for the stretched film used as the optical film 62, it is preferred that the content of volatile components remaining in the film is 100 ppm by mass or less. A stretched film whose volatile component content is in the above range is free from display unevenness even after prolonged use, and presents great stability of optical properties. Here, the volatile components are substances that are contained in trace amounts in the thermoplastic resin, that have a molecular weight of 200 or less, and that have a relatively low boiling point, and examples thereof include residual monomers remained in the thermoplastic resin after polymerization of the thermoplastic resin, and the solvent. The content of volatile components may be determined by analyzing the thermoplastic resin with gas chromatography.

Examples of methods of obtaining a stretched film having a volatile component content of 100 ppm by mass or less include: (a) performing oblique stretching of an unstretched film having a volatile component content of 100 ppm by mass or less; and (b) performing oblique stretching of an unstretched film having a volatile component content of more than 100 ppm by mass, and drying the film during or after the oblique stretching to reduce the volatile component content. Among these, the method (a) is preferred for obtaining a stretched film with a lower volatile component content. In the method (a), to obtain an unstretched film having a volatile component content of 100 ppm by mass or less, it is preferred to perform melt extrusion of a resin having a volatile component content of 100 ppm by mass or less.

Additionally, the stretched film used as the optical film 62 preferably has a saturated water absorption of 0.01 mass % or less, and more preferably 0.007 mass % or less. If the saturated water absorption exceeds 0.01 mass %, the stretched film may be subject to dimensional changes depending on the usage environment, and internal stress may occur. Additionally, for example, when using a reflection type liquid crystal panel as the display panel 20, display unevenness can occur, such as partial lightening of a black presentation (assuming a whitish appearance). By contrast, a stretched film whose saturated water absorption is in the above range is free from display unevenness even after prolonged use, and presents great stability of optical properties.

In addition, when the saturated water absorption of the optical film 62 is 0.01 mass % or less, it is possible to suppress the change in relative permittivity of the optical film 62 over time due to water absorption. Therefore, as illustrated in FIG. 1, even if the substrate 60 having the optical film 62 is arranged between the first conductive layer 70 and the second conductive layer 50 constituting the capacitive touch sensor, it is possible to reduce variations in detection sensitivity of the touch sensor due to change in the relative permittivity of the optical film 62.

It is noted that the saturated water absorption of the stretched film may be adjusted by changing, for example, the type of the thermoplastic resin used in the formation of the film.

Also, the relative permittivity of the stretched film used as the optical film 62 is preferably 2 or more and preferably 5 or less, and particularly preferably 2.5 or less. As illustrated in FIG. 1, in this example of the display device with a capacitive touch panel 100, the substrate 60 having the optical film 62 is arranged between the first conductive layer 70 and the second conductive layer 50 constituting the capacitive touch sensor. Therefore, by decreasing the relative permittivity of the optical film 62 included in the base member 60, it is possible to reduce the electrostatic capacity between the first conductive layer 70 and the second conductive layer 50 to improve the detection sensitivity of the capacitive touch sensor.

[[Hard Coat Layer]] The hard coat layers 61, 63 formed on both surfaces of the optical film 62 are for preventing damage to and curling of the optical film 62. As the material used in the formation of the hard coat layers 61, 63, a material that shows a hardness of "HB" or higher in the pencil hardness test prescribed in JIS K5700 is suitable. Examples of such materials include: hard coat layer-forming organic materials such as organic silicone-based, melamine-based, epoxy-based, acrylate-based, and polyfunctional (meth)acrylic-based compounds; and hard coat layer-forming inorganic materials such as silicon dioxide. Among these, (meth)acrylate-based compounds and polyfunctional (meth)acrylic-based compounds are preferably used as the hard coat layer-forming material in view of their good adhesive strength and excellent productivity. As used herein, "(meth)acrylate" refers to acrylate and/or methacrylate, and "(meth)acrylic" refers to acrylic and/or methacrylic.

Examples of (meth)acrylates include those having one polymerizable unsaturated group per molecule, those having two polymerizable unsaturated groups per molecule, those having three or more polymerizable unsaturated groups per molecule, and (meth)acrylate oligomers containing three or more polymerizable unsaturated groups per molecule. The (meth)acrylates may be used alone or in combination of two or more.

The method of forming the hard coat layers is not particularly limited. The hard coat layers are formed by: coating a coating liquid including the hard coat layer-forming material on the optical film 62 by a known method, such as a dipping method, a spray method, a slide coating method, a bar coating method, a roll coater method, a die coater method, a gravure coater method, and a screen printing method; removing the solvent by drying in air or in a nitrogen atmosphere or the like; and subsequently, either applying thereon an acrylic-based hard coat layer material and irradiating it with ultraviolet light, electron beam, or the like so as to be cured by crosslinking, or applying thereon a silicone-based, melamine-based, or epoxy-based hard coat layer material and causing it to thermoset. Since the film thickness of the coating film tends to become uneven during the drying process, it is preferred to adjust and control air intake and exhaust to avoid deterioration in the appearance of the coating film, so that the coating film becomes uniform over the entire surface. When using an ultraviolet curable material, the irradiation time it takes for the hard coat layer-forming material after the coating to be cured by being irradiated with ultraviolet light is usually in the range of 0.01 seconds to 10 seconds, and the amount of irradiation from the energy ray source is usually in the range of 40 mJ/cm$^2$ to 1000 mJ/cm$^2$ in terms of cumulative exposure with ultraviolet light wavelength of 365 nm. The ultraviolet light irradiation may be performed in an inert gas such as nitrogen and argon, or in air.

It is noted that if the hard coat layers 61, 63 are provided, surface treatment may be applied to the stretched film used as the optical film 62 for the purpose of increasing the adhesiveness to the hard coat layers 61, 63. Examples of the surface treatment include plasma treatment, corona treatment, alkali treatment, and coating treatment. In particular, in the case where the optical film 62 is formed from a thermoplastic norbornene-based resin, the use of corona treatment allows for providing strong adhesion between the optical film 62 formed from the above thermoplastic norbornene-based resin and the hard coat layers 61, 63. As a corona treatment condition, the amount of irradiation of corona discharge electron is preferably 1 W/m$^2$/min to 1000 W/m$^2$/min. The contact angle with water of the optical film 62 after the above corona treatment is preferably from 10~ to 500. In addition, coating with the coating liquid including the hard coat layer-forming material may be performed immediately after the corona treatment or after neutralization. For better appearance of the hard coat layers 61, 63, however, the coating is preferably performed after neutralization.

The hard coat layers 61, 63 formed on the optical film 62 normally have an average thickness of 0.5 μm or more and 30 μm or less, and preferably 2 μm or more and 15 μm or less. If the hard coat layers 61, 63 are increased in thickness excessively out of this range, this may cause a problem with visibility, while if the hard coat layers 61, 63 are reduced in thickness excessively, this may result in poor scratch resistance.

The haze of the hard coat layers 61, 63 is 0.5% or less, and preferably 0.3% or less. By setting such haze values, the hard coat layers 61, 63 can be used suitably in the display device with a touch panel 100.

It is noted that to the hard coat layer-forming material may be added, without departing from the spirit of the disclosure, organic particles, inorganic particles, a photosensitizer, a polymerization inhibitor, a polymerization initiation aid, a leveling agent, a wettability improving agent, a surfactant, a plasticizer, an ultraviolet absorber, an antioxidant, an antistatic agent, a silane coupling agent, and the like.

It is noted that in the display device with a capacitive touch panel according to the disclosure, the substrate 60 may not have hard coat layers 61, 63, or alternatively the substrate 60 may have an optical functional layer, such as an index matching layer and a low refractive index layer, instead of or in addition to the hard coat layers 61, 63.

[[Index Matching Layer]]

For example, index matching layers are provided (at respective interfaces) between the optical film 62 of the substrate 60 and the conductive layers 50, 70 formed on the substrate 60, particularly for the purpose of preventing reflection of light at the respective interfaces between the layers caused by the difference in refractive index between the optical film 62 and the first conductive layer 70. Examples of the index matching layer include those comprising multiple high refractive index films and multiple low refractive index films that are alternately arranged, and resin layers comprising metals such as zirconia. Even if the optical film 62 and the conductive layers 50, 70 greatly differ in refractive index, arranging respective index matching layers adjacent to the conductive layers 50, 70 between the optical film 62 and the conductive layers 50, 70 makes it possible to prevent the reflectance from varying significantly at regions in the substrate 60, depending on whether the conductive layers 50, 70 are provided or not.

[[Low Refractive Index Layer]]

A low refractive index layer is provided for the purpose of preventing reflection of light and may be provided, for example, on each of the hard coat layers 61, 63. If provided on the hard coat layers 61, 63, the respective low refractive index layers represent layers, each having a refractive index lower than that of the hard coat layers 61, 63. The refractive index of each low refractive index layer is preferably in the range of 1.30 to 1.45, and more preferably in the range of 1.35 to 1.40, at 23° C. and wavelength of 550 nm.

As the low refractive index layers, inorganic compounds that are formed from $SiO_2$, $TiO_2$, NaF, $Na_3AlF_6$, LiF, $MgF_2$, $CaF_2$, SiO, $SiO_x$, $LaF_3$, $CeF_3$, $Al_2O_3$, $CeO_2$, $Nd_2O_3$, $Sb_2O_3$, $Ta_2O_5$, $ZrO_2$, ZnO, ZnS, or the like are preferred. In addition, a mixture of an inorganic compound with an organic compound such as an acrylic resin, a urethane resin, and a siloxane-based polymer is preferably used as the low refractive index layer-forming material. One example is a low refractive index layer that is formed by applying a composition containing an ultraviolet curable resin and hollow silica particles, and irradiating with ultraviolet light. The film thickness of the low refractive index layer is preferably 70 nm or more and 120 nm or less, and more preferably 80 nm or more and 110 nm or less. If the film thickness of the low refractive index layer is more than 120 nm, reflected colors are so tinged that color reproducibility is lost at the time of black presentation, which fact may reduce visibility and cause undesirable results.

[Cover Layer]

The cover layer 80 may be formed by using a known member, for example, a plate that is made of glass or plastic and is transparent to visible light.

Additionally, with the display device with a capacitive touch panel 100, since the substrate 60 provided with the optical film 62 having a predetermined phase difference is arranged between the viewer-side polarizing plate 40 and the cover layer 80, it is possible to convert linearly polarized light traveling through the viewing-side polarizing plate 40 towards the cover layer 80 side into circularly polarized light or elliptically polarized light. Thus, the display device with a capacitive touch panel 100 enables the operator to visually recognize the displayed content on the display device through polarized sunglasses even under the condition of so-called crossed nicols, in which the transmission axis of the polarized sunglasses worn by the operator and the transmission axis of the polarizing film 42 of the viewing-side polarizing plate 40 are set orthogonal to each other In addition, in the display device with a capacitive touch panel 100, since the second conductive layer 50 and the first conductive layer 70 are both provided on the substrate 60, there is no need to provide separate transparent base plates for forming the second and first conductive layers. Accordingly, it is possible to simplify the structure of the touch sensor and reduce the number of members present between the viewing-side polarizing plate 40 and the cover layer 80, thereby reducing the thickness between the liquid crystal panel as the display panel 20 and the cover layer 80. As a result, a reduction in thickness of the display device 100 can be achieved. In the display device 100, since the conductive layers 50, 70 are formed on both surfaces of the substrate 60, it is possible, for example, to effectively prevent formation of displaced pattern of the second conductive layer 50 and the first conductive layer 70, which would otherwise occur at the time of stacking members, as compared to the case where one of the conductive layers 50, 70 is formed on a surface of the substrate 60 and the other is formed on a surface of another member.

Moreover, in the above example of the display device 100, since the first conductive layer 70 and the second conductive layer 50 constituting the capacitive touch sensor are disposed between the viewing-side polarizing plate 40 and the cover layer 80, it is possible to maintain a sufficient distance, even in the device with a reduced thickness, between the liquid crystal panel as the display panel 20 and the first conductive layer 70 and second conductive layer 50 constituting the touch sensor, and to suppress a decrease in sensitivity of the touch sensor caused by the influence of electrical noise from the liquid crystal panel side, as compared to the case where the first conductive layer 70 and the second conductive layer 50 are provided closer to the liquid crystal panel than is the viewing-side polarizing plate 40.

In addition, in the display device 100, since the substrate 60 is disposed between the first conductive layer 70 and the second conductive layer 50, a capacitive touch sensor can be easily formed. Further, since a film exhibiting low relative permittivity and low saturated water absorption can be used as the optical film 62 of the substrate 60, a capacitive touch sensor can be formed favorably.

Display Device with Capacitive Touch Panel
(Second Embodiment)

Figure 2:
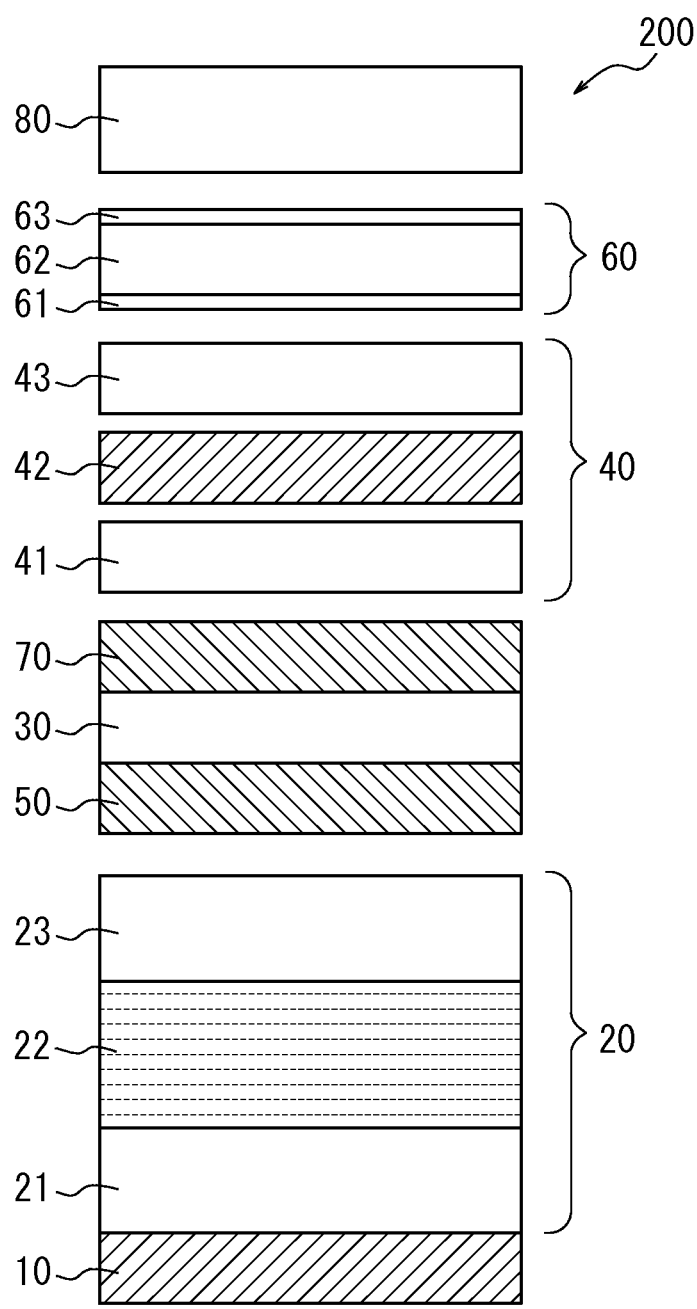
FIG. 2 is a diagram schematically illustrating a cross-sectional structure of the main part of a second display device with a capacitive touch panel according to the disclosure.

FIG. 2 schematically illustrates a cross-sectional structure of the main part of a second display device with a capacitive touch panel according to the disclosure.

Here, the display device with a capacitive touch panel 200 illustrated in FIG. 2 differs from the example of the display device with a capacitive touch panel 100 as described previously in the following points:

the second conductive layer 50 is formed not on one surface (on the display panel 20 side) of the substrate 60, but on one surface (on the display panel 20 side) of a display panel-side substrate formed by the phase difference film 30 for optical compensation; and the first conductive layer 70 is formed not on the other surface (on the cover layer 80 side) of the substrate 60, but on the other surface (on the cover layer 80 side) of the display panel-side substrate formed by the phase difference film 30 for optical compensation.

The display device with a capacitive touch panel 200 has otherwise the same features as the display device with a capacitive touch panel 100.

Here, the formation of the second conductive layer 50 and the first conductive layer 70 on the display panel-side substrate formed by the phase difference film 30 may be performed by using the same method as used in the formation of the conductive layers in the display device with a capacitive touch panel 100.

In addition, as illustrated in FIG. 2, in the display device with a capacitive touch panel 200 according to this example, the first conductive layer 70 and second conductive layer 50 constituting the capacitive touch sensor are arranged to face each other across the display panel-side substrate formed by the phase difference film 30. Accordingly, if the display panel-side substrate formed by the phase difference film 30 has a uniform thickness variation, it is possible to maintain a constant distance between the first conductive layer 70 and the second conductive layer 50 and to afford the touch sensor good detection sensitivity.

It is noted that the display device with a capacitive touch panel 200 may not have the substrate 60. In addition, in the display device with a capacitive touch panel 200, the display panel-side substrate may have hard coat layers, index matching layers, or low refractive index layers formed on both surfaces of the phase difference film 30. Here, such hard coat layers, index matching layers, or low refractive index layers may be the same as those formed on the surfaces of the optical film 62 of the substrate 60. Moreover, in the display device with a capacitive touch panel 200, the display panel-side substrate may be formed by a web of film with predetermined optical functionality, rather than the phase difference film 30.

Also, similar to the aforementioned example of the display device with a capacitive touch panel 100, the display device with a capacitive touch panel 200 enables the operator to visually recognize the displayed content even under the condition of so-called crossed nicols, in which the transmission axis of the polarize sunglasses worn by the operator and the transmission axis of the polarizing film 42 of the viewing-side polarizing plate 40 are set orthogonal to each other. In addition, since the second conductive layer 50 and the first conductive layer 70 are both provided on the display panel-side substrate (the phase difference film 30), it is possible to compensate, by the phase difference film 30, for viewing angle dependence of the liquid crystal panel as the display panel 20, a light leakage phenomenon occurring at the polarizing plate at the time of oblique angle viewing, and the like, and simplify the structure of the touch sensor, thereby reducing the thickness between the liquid crystal panel as the display panel 20 and the cover layer 80. In addition, in the display device 200, a capacitive touch sensor may be formed easily and favorably by using the display panel-side substrate formed by the phase difference film 30.

In the display device 200, since the conductive layers 50, 70 are formed on both surfaces of the phase difference film 30 as the display panel-side substrate, it is possible, for example, to effectively prevent formation of displaced pattern of the second conductive layer 50 and the first conductive layer 70, which would otherwise occur at the time of stacking members, as compared to the case where one of the conductive layers 50, 70 is formed on a surface of the phase difference film 30 and the other is formed on a surface of another member.

Display Device with Capacitive Touch Panel (Third Embodiment)

Figure 3:
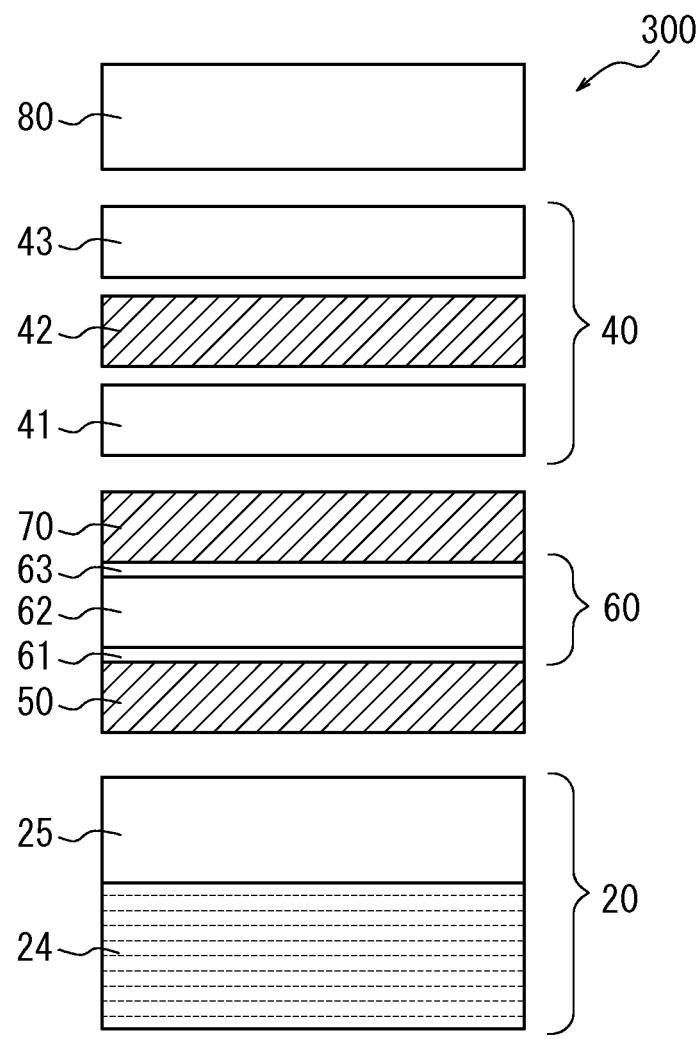
FIG. 3 is a diagram schematically illustrating a cross-sectional structure of the main part of a third display device with a capacitive touch panel according to the disclosure.

FIG. 3 schematically illustrates a cross-sectional structure of the main part of a third display device with a capacitive touch panel according to the disclosure. It is noted here that the display device with a capacitive touch panel 300 illustrated in FIG. 3 is a device that has both a display function and a touch sensor function, the display function for displaying image information on the screen and the touch sensor function for detecting a position on the screen touched by the operator and outputting it as an information signal to the outside.

The display device with a capacitive touch panel 300 comprises the following members stacked in the stated order from the side on which the organic EL display (OLED) panel is arranged (the lower side of FIG. 3, and this side is hereinafter referred to simply as the "display panel side") towards the side from which the operator views an image (the upper side of FIG. 3, and this side is hereinafter referred to simply as the "viewing side"): an organic EL display (OLED) panel 24 and a barrier layer 25 as a display panel 20; a second conductive layer 50; a substrate 60; a first conductive layer 70; a display panel-side protective film 41, a polarizing film 42, and a cover layer-side protective film 43 as a polarizing plate 40; and a cover layer 80. Additionally, in the display device with a capacitive touch panel 300, the first conductive layer 70 is formed on one surface (on the cover layer 80 side) of the substrate 60 and the second conductive layer 50 is formed on the other surface (on the display panel 20 side) of the substrate 60. In addition, in the display device 300, the polarizing plate 40 and the substrate 60 positioned closer to the display panel 20 than is the polarizing plate 40 constitute a circularly polarizing plate.

It is noted that the display panel 20, the substrate 60 formed with the second conductive layer 50 and first conductive layer 70, the display panel-side protective film 41, the polarizing film 42, the cover layer-side protective film 43, and the cover layer 80 may be integrated into a single structure by bonding the members together using known means, such as providing adhesive layers or pressure sensitive adhesive layers, performing plasma treatment on the surfaces of members, and the like. That is, for example, adhesive layers or pressure sensitive adhesive layers are formed in gaps in the layered structure illustrated in FIG. 3.

[Organic EL Display (OLED) Panel]

As the organic EL display (OLED) panel 24, for example, an organic EL display (OLED) panel may be used that has, on a surface of a transparent base plate, a transparent electrode formed from a transparent electrode material, a light-emitting layer stacked on the transparent electrode and made from an EL material, and a back electrode stacked on the light-emitting layer and formed to face the transparent electrode, and that emits light on the transparent base plate side. Additionally, in the display device with a capacitive touch panel 300, the organic EL display (OLED) panel 24 is energized to present a desired image to the operator.

It is noted that any known material may be used as the transparent electrode, the light-emitting layer, and the back electrode. In addition, the display panel which may be used in the display device with a capacitive touch panel disclosed herein is not limited to the one using the organic EL display (OLED) panel 24 with the aforementioned structure.

[Barrier Layer]

The barrier layer 25 positioned on the viewing side of the organic EL display (OLED) panel 24 may be formed by using a known member, for example, a plate that is made of glass or plastic and is transparent to visible light.

[Second Conductive Layer]

The second conductive layer 50 is formed on the other surface (on the display panel 20 side) of the substrate 60, and is positioned between the barrier layer 25 and the substrate 60. Additionally, the second conductive layer 50 forms a capacitive touch sensor, in conjunction with the first conductive layer 70. The second conductive layer 50 used in this case may be the same as that used in the display device with a capacitive touch panel 100.

[First Conductive Layer]

The first conductive layer 70 is formed on one surface (on the cover layer 80 side) of the substrate 60 and is positioned closer to the cover layer 80 than is the second conductive layer 50, more specifically, between the polarizing plate 40 and the substrate 60. Additionally, the first conductive layer 70 forms a capacitive touch sensor, in conjunction with the second conductive layer 50 positioned apart in the stacking direction across the substrate 60. Here, the first conductive layer 70 may be formed by using the same material as that used for the second conductive layer 50.

In addition, the formation of the first conductive layer 70 and the second conductive layer 50 on respective surfaces of the substrate 60 may be performed by using the same method as the display device with a capacitive touch panel 100.

[Substrate with Optical Film]

The substrate 60 is positioned between the first conductive layer 70 and the second conductive layer 50, and has an optical film 62 with a phase difference of λ/4 and hard coat layers 61, 63 formed on both surfaces of the optical film 62, as illustrated in FIG. 3. Additionally, the optical film 62 of the substrate 60 is arranged so that a slow axis of the optical film 62 and a transmission axis of a polarizing film 42 of the polarizing plate 40 as detailed below intersect at a predetermined angle as viewed in the stacking direction.

In this case, "a predetermined angle" refers to an angle at which a circularly polarizing plate can be formed by the polarizing plate 40 and the optical film 62, and it is possible to prevent reflected light of incident external light from making visual recognition of the displayed content difficult. Specifically, the predetermined angle is an angle at which linearly polarized light traveling from the cover layer 80 side through the polarizing plate 40 towards the display panel 20 side can be converted by the optical film 62 into circularly polarized light (for example, about 45°), and more specifically covers angles of 45°±5°, preferably 45°±3°, more preferably 45°±1°, and even more preferably 45°±0.3°.

In addition, the phrase "with a phase difference of λ/4" indicates that the phase difference (retardation Re) to be applied to light transmitted through the optical film 62 in the stacking direction is about ¼ times the wavelength λ of the light. Specifically, in the case where the transmitted light has a wavelength range from 400 nm to 700 nm, and when Re is about ¼ times the wavelength λ, it is meant that Re is in the range of λ/4±65 nm, preferably in the range of λ/4±30 nm, and more preferably in the range of λ/4±10 nm. It is noted that Re is the retardation in the in-plane direction represented by the equation $Re=(nx-ny)\times d$, where nx is the refractive index in the film plane in the slow axis direction, ny is the refractive index in a direction orthogonal, in the film plane, to the slow axis in the film plane, and d is the thickness of the optical film 62.

In addition, as illustrated in FIG. 3, in the display device with a capacitive touch panel 300 according to this example, the first conductive layer 70 and second conductive layer 50 constituting the capacitive touch sensor are arranged to face each other across the substrate 60 having the optical film 62. Accordingly, if the substrate 60 has a uniform thickness variation, it is possible to maintain a constant distance between the first conductive layer 70 and the second conductive layer 50 and to afford the touch sensor good detection sensitivity.

[[Optical Film]]

The optical film 62 used in this case may be the same as that used in the display device with a capacitive touch panel 100.

It is noted that the optical film 62 forming part of the circularly polarizing plate in the display device with a capacitive touch panel 300 preferably has reverse wavelength dispersion characteristics such that the phase difference imparted to light incident on the optical film is wavelength dependent, namely, the phase difference becomes larger at long wavelength and smaller at short wavelength. In this way, the phase difference imparted to light incident on the optical film increases in absolute value with increasing wavelength of the light and decreases in absolute value with decreasing wavelength of the light, and therefore, desirable polarization characteristics can be obtained over a wide wavelength range and linearly polarized light can be converted into circularly polarized light.

[[Hard Coat Layer]]

The hard coat layers 61, 63 formed on both surfaces of the optical film 62 used in this case may be the same as those used in the display device with a capacitive touch panel 100.

[[Index Matching Layer]]

The index matching layer used in this case may be the same as that used in the display device with a capacitive touch panel 100.

As is the case with the display device with a capacitive touch panel 100, the substrate 60 may not have the hard coat layers 61, 63, or alternatively the substrate 60 may have an optical functional layer, such as an index matching layer and a low refractive index layer, instead of or in addition to the hard coat layers 61, 63.

[Polarizing Plate]

The polarizing plate 40 is not particularly limited, and an example thereof may be a polarizing plate 40 that is formed with the polarizing film 42 sandwiched between two protective films (display panel-side protective film 41 and cover layer-side protective film 43). As mentioned above, the transmission axis of the polarizing film 42 and the slow axis of the optical film 62 of the substrate 60 are arranged so as to intersect at about 45° as viewed in the stacking direction (the vertical direction in FIG. 3). It is noted that in the case of producing a laminate including the polarizing plate 40 and the substrate 60 by a roll-to-roll process, it suffices to adjust the orientation angle of the obliquely stretched film used as the optical film 62 such that the slow axis of the optical film 62 and the transmission axis of the polarizing film 42 intersect at the aforementioned predetermined angle in the resulting laminate.

[Cover Layer]

The cover layer 80 may be formed by using a known member, for example, a plate that is made of glass or plastic and is transparent to visible light.

Additionally, in the display device with a capacitive touch panel 300, the circularly polarizing plate formed by the polarizing plate 40 and the substrate 60 is arranged between the cover layer 80 and the display panel 20, where the polarizing plate 40 has the polarizing film 42 and the substrate 60 has the optical film 62 with a predetermined phase difference and being arranged at a predetermined optical axis angle. This arrangement allows for preventing reflected light of incident external light from making visual recognition of the displayed content difficult. Specifically, linearly polarized light traveling from the cover layer 80 side through the polarizing plate 40 towards the display panel 20 side is converted into circularly polarized light by the optical film 62 of the substrate 60, and reverse circularly polarized light resulting from the circularly polarized light reflected at the display panel 20 is converted into another linearly polarized light orthogonal to the linearly polarized light by the optical film 62 of the substrate 60. In this way, it is possible to prevent, by the polarizing plate 40, transmission of said another linearly polarized light into the cover layer 80 side. Therefore, the display device with a capacitive touch panel 300 enables the operator to visually recognize the displayed content easily without interruption of reflected light.

In addition, in the display device with a capacitive touch panel 300, since the second conductive layer 50 and the first conductive layer 70 are both provided on the substrate 60, there is no need to provide separate transparent base plates for forming the second conductive layer 50 and the first conductive layer 70. Accordingly, it is possible to simplify the structure of the touch sensor and reduce the number of members present between the display panel 20 and the cover layer 80, thereby reducing the thickness between the display panel 20 and the cover layer 80. As a result, a reduction in thickness of the display device 300 can be achieved. In the display device 300, since the conductive layers 50, 70 are formed on both surfaces of the substrate 60, it is possible, for example, to effectively prevent inconsistent patterning of the first conductive layer 70 and the second conductive layer 50, which would otherwise occur at the time of stacking members, as compared to the case where one of the conductive layers 50, 70 is formed on a surface of the substrate 60 and the other is formed on a surface of another member.

Moreover, in the display device 300 according to the above example, since the substrate 60 is disposed between the first conductive layer 70 and the second conductive layer 50, a capacitive touch sensor can be easily formed. Further, since a film exhibiting low relative permittivity and low saturated water absorption can be used as the optical film 62 of the substrate 60, a capacitive touch sensor can be formed favorably.

Display Device with Capacitive Touch Panel
(Variation of Third Embodiment)

Figure 4:
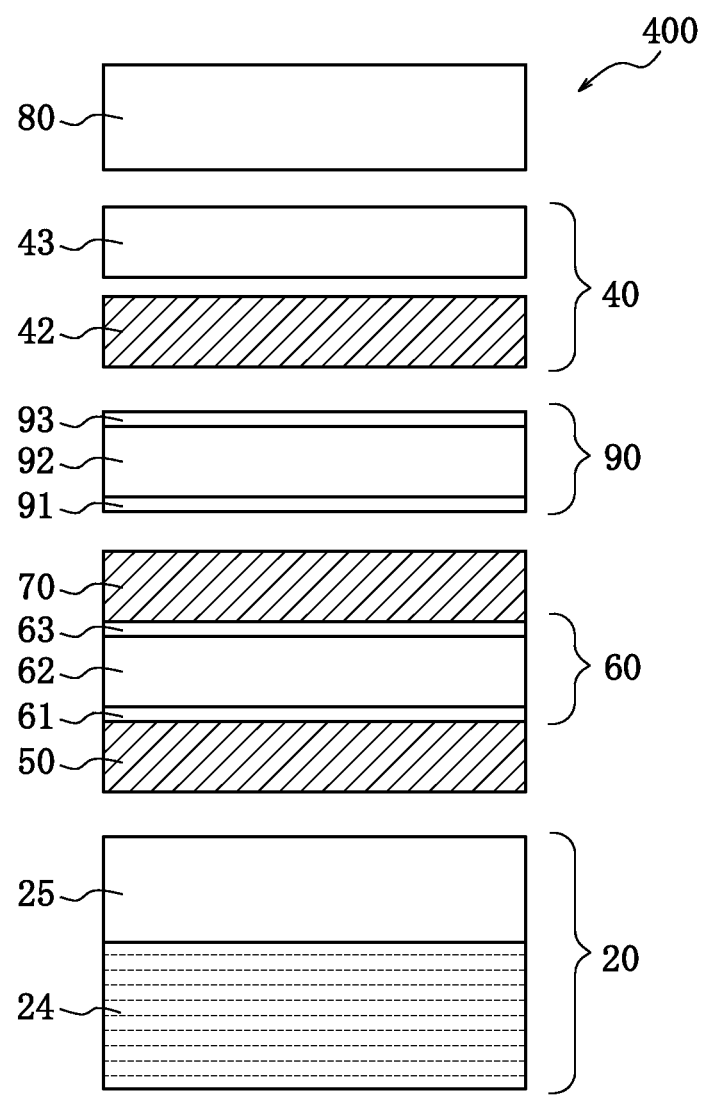
FIG. 4 is a diagram schematically illustrating a cross-sectional structure of the main part of a fourth display device with a capacitive touch panel according to the disclosure.

FIG. 4 schematically illustrates a cross-sectional structure of the main part of a fourth display device with a capacitive touch panel according to the disclosure.

Here, the display device with a capacitive touch panel 400 illustrated in FIG. 4 differs from the example of the display device with a capacitive touch panel 300 as described previously in the following points:
the polarizing plate 40 does not have the display panel-side protective film 41, and the polarizing film 42 is positioned at a surface (the lower surface in FIG. 4) of the polarizing plate 40 on the display panel 20 side;
the display device 400 further comprises a polarizing plate-side substrate 90 between the substrate 60 and the polarizing plate 40, more specifically between the first conductive layer 70 formed on a surface of the substrate 60 and the polarizing film 42 of the polarizing plate 40, and the substrate 60, the polarizing plate-side substrate 90, and the polarizing plate 40 form a circularly polarizing plate;
the polarizing plate-side substrate 90 is bonded to a surface, on the display panel 20 side, of the polarizing film 42 of the polarizing plate 40, and the polarizing plate-side substrate 90 is bonded to a surface of the first conductive layer 70 on the cover layer 80 side;
the polarizing plate-side substrate 90 has another optical film 92 with a phase difference of $\lambda/2$; and
the slow axis of the optical film 62, a slow axis of said another optical film 92, and the transmission axis of the polarizing film 42 intersect at a predetermined angle.

The display device with a capacitive touch panel 400 has otherwise the same features as the display device with a capacitive touch panel 300.

Here, the bonding of the polarizing plate-side substrate 90 on the polarizing film 42 and on the first conductive layer 70 may be performed by using known adhesive layers or pressure sensitive adhesive layers.

The polarizing plate-side substrate 90 has said another optical film 92 with a phase difference of $\lambda/2$ and hard coat layers 91, 93 formed on both surfaces of the optical film 92. Additionally, said another optical film 92 can be produced by using the same material and method as those used for the optical film 62.

As used herein, the phrase "with a phase difference of $\lambda/2$" indicates that the phase difference (retardation Re) to be applied to light transmitted through said another optical film of the polarizing plate-side substrate 90 in the stacking direction is about one-half of the wavelength $\lambda$ of the light.

Specifically, in the case where the transmitted light has a wavelength range from 400 nm to 700 nm, and when Re is about one-half of the wavelength $\lambda$, it is meant that Re is in the range of $\lambda/2 \pm 65$ nm, preferably in the range of $\lambda/2 \pm 30$ nm, and more preferably in the range of $\lambda/2 \pm 10$ nm. It is noted that Re is the retardation in the in-plane direction represented by the equation $Re=(nx-ny) \times d$, where nx is the refractive index in the film plane in the slow axis direction, ny is the refractive index in a direction orthogonal, in the film plane, to the slow axis in the film plane, and d is the thickness of said another optical film 92.

In addition, the optical film 62 of the substrate 60 and said another optical film 92 of the polarizing plate-side substrate 90 represent two optical plates (so-called wideband quarter wavelength plates) that impart a phase difference of $\lambda/4$ when used in a pair, and are preferably formed from the same material having the same wavelength dispersion characteristics.

Moreover, the optical film 62 and said another optical film 92 are arranged so that the slow axis of the optical film 62 intersects the transmission axis of the polarizing film 42 of the polarizing plate 40, and the slow axis of said another optical film 92 of the polarizing plate-side substrate 90 intersects the transmission axis of the polarizing film 42 of the polarizing plate 40, at predetermined angles, respectively, as viewed in the stacking direction.

In this case, "predetermined angles" represent angles at which a wideband quarter wavelength plate can be formed, specifically angles at which linearly polarized light A traveling from the cover layer 80 side through the polarizing plate 40 towards the display panel 20 side is converted into circularly polarized light A after passing through said another optical film 92 and the optical film 62 sequentially, and reverse circularly polarized light B resulting from the circularly polarized light A reflected at the display panel 20 is converted into another linearly polarized light B orthogonal to the linearly polarized light A after passing through the optical film 62 and said another optical film 92 sequentially.

Specifically, if it is now assumed that said another optical film 92 and the optical film 62 have the same wavelength dispersion characteristics, and that X° is an angle at which the slow axis of the optical film 62 intersects the transmission axis of the polarizing film 42, and Y° is an angle at which the slow axis of said another optical film 92 of the polarizing plate-side substrate 90 intersects the transmission axis of the polarizing film 42, "predetermined angles" represent angles at which the following equation holds: X−2Y=45°. More specifically, for example, possible combinations of "predetermined angles" include: (i) about 75° at which the slow axis of the optical film 62 intersects the transmission axis of the polarizing film 42 and about 15° at which the slow axis of said another optical film 92 of the polarizing plate-side substrate 90 intersects the transmission axis of the polarizing film 42, and (ii) about 90° at which the slow axis of the optical film 62 intersects the transmission axis of the polarizing film 42 and about 22.5° at which the slow axis of said another optical film 92 of the polarizing plate-side substrate 90 intersects the transmission axis of the polarizing film 42.

As used herein, "about 75°" more specifically covers angles of 75°±5°, preferably 75°±3°, more preferably 75°±1°, and even more preferably 75°±0.3°, "about 15°" more specifically covers angles of 150±5°, preferably 15°±3°, more preferably 15°±1°, and even more preferably 15°±0.3°, "about 90°" more specifically covers angles of 90°±5°, preferably 90°±3°, more preferably 90°±1°, and even more preferably 90°±0.3°, and "about 22.5°" more specifically covers angles of 22.5°±5°, preferably 22.5°±3°, more preferably 22.5°±1°, and even more preferably 22.5°±0.3°.

It is noted that in view of the fact that the laminate including the polarizing plate 40 can be produced easily by a roll-to-roll process, the optical film 62 is preferably a vertical stretched film when forming an intersection angle of about 90° with the transmission axis of the polarizing film 42, or the optical film 62 is preferably an obliquely stretched film when forming an intersection angle of about 75° with the transmission axis of the polarizing film 42, and said another optical film 92 is preferably an obliquely stretched film when forming an intersection angle of about 15° with the transmission axis of the polarizing film 42, or said another optical film 92 is preferably an obliquely stretched film when forming an intersection angle of about 22.5° with the transmission axis of the polarizing film 42.

In the above variation of the third embodiment, even if the difference in refractive index between the substrate and the layer stacked directly on the substrate (for example, the conductive layer, hard coat layer, adhesive layer, or pressure sensitive adhesive layer) is 0.05 or more, there is no need to provide an index matching layer in the absence of the influence of interfacial reflection (for example, when the first conductive layer 70 is formed on the display panel 20 side of the polarizing plate-side substrate 90).

Additionally, the aforementioned display device with a capacitive touch panel 400 enables the operator to visually recognize the displayed content easily, as is the case with the example of the display device with a capacitive touch panel 300 as described previously. It is also possible to simplify the structure of the touch sensor and reduce the number of members present between the display panel 20 and the cover layer 80, thereby reducing the thickness between the display panel 20 and the cover layer 80. In addition, in the display device 400, a capacitive touch sensor may be formed easily and favorably by using the substrate 60.

Moreover, in the display device with a capacitive touch panel 400, there is no need to provide an index matching layer, which fact makes it possible to simplify the structure of the touch sensor to thereby reduce the thickness between the display panel and the cover layer.

It is noted that in the display device 400, it is possible to cause the polarizing plate-side substrate 90 to function as a protective film for the polarizing film 42, which may thus make the display panel-side protective film 41 of the polarizing plate 40 unnecessary, thereby reducing the thickness of the polarizing plate 40. Accordingly, it is possible to further reduce the thickness between the display panel 20 and the cover layer 80.

In addition, in the display device 400, it is possible to form a so-called wideband quarter wavelength plate by using the optical film 62 and said another optical film 92, to yield desired polarization characteristics in a wide wavelength range, and to convert linearly polarized light into circularly polarized light favorably.

In the display device 400, since the conductive layers 50, 70 are formed on both surfaces of the substrate 60, it is possible, for example, to effectively prevent formation of displaced pattern of the second conductive layer 50 and the first conductive layer 70, which would otherwise occur at the time of stacking members, as compared to the case where one of the conductive layers 50, 70 is formed on a surface of the substrate 60 and the other is formed on a surface of another member.

While examples of the display device with a capacitive touch panel according to the disclosure have been described above, the display device with a capacitive touch panel according to the disclosure is not limited to the above examples, but is capable of modifications as deemed appropriate.

INDUSTRIAL APPLICABILITY

According to the disclosure, it is possible to provide a display device with a capacitive touch panel that is reduced in thickness.

According to the disclosure, it is also possible to provide a display device with a capacitive touch panel that can be operated by the operator even through polarized sunglasses and is reduced in thickness.

Moreover, according to the disclosure, it is possible to provide a display device with a capacitive touch panel that can prevent reflected light of incident external light from making visual recognition of the displayed content difficult, and that is reduced in thickness.

REFERENCE SIGNS LIST

10 Backlight-side polarizing plate
20 Display panel
21 Thin film transistor base plate
22 Liquid crystal layer
23 Color filter base plate
24 Organic EL display (OLED) panel
25 Barrier layer
30 Phase difference film
40 Viewing-side polarizing plate, Polarizing plate
41 Backlight-side (display panel-side) protective film
42 Polarizing film
43 Cover layer-side protective film
50 Second conductive layer 60 Substrate
61, 63 Hard coat layer
62 Optical film
70 First conductive layer
80 Cover layer
90 Polarizing plate-side substrate
91, 93 Hard coat layer
92 Another optical film
100, 200, 300, 400 Display device with capacitive touch panel

The invention claimed is:

1. A display device with a capacitive touch panel, comprising:
a display panel;
a cover layer; and
a laminate between the display panel and the cover layer, the laminate having:
a viewing-side polarizing plate having a polarizing film;
a substrate having an optical film with a phase difference of $(2n-1)\lambda/4$, where n is a positive integer, a slow axis of the optical film intersecting a transmission axis of the polarizing film at an angle of about 45° as viewed in a stacking direction;
a first conductive layer that is formed on a surface of the substrate facing the cover layer; and
a second conductive layer that is formed on a surface of the substrate facing the display panel, the first conductive layer, the second conductive layer, and the substrate being positioned closer to the cover layer than is the viewing-side polarizing plate, and the first conductive layer being positioned closer to the cover layer than is the second conductive layer, and the first conductive layer and the second conductive layer being arranged apart from each other in the stacking direction so as to form a capacitive touch sensor.

2. The display device with a capacitive touch panel according to claim 1, wherein the display panel is a liquid crystal panel.

3. The display device with a capacitive touch panel according to claim 1, wherein the optical film or the other optical film is an obliquely stretched film.

4. The display device with a capacitive touch panel according to claim 1, wherein the optical film, the phase difference film, or the other optical film is formed from a cycloolefin polymer, polycarbonate, polyethylene terephthalate, or triacetyl cellulose.

5. The display device with a capacitive touch panel according to claim 4, wherein the optical film, the phase difference film, or the other optical film is a cycloolefin polymer without a polar group.

6. The display device with a capacitive touch panel according to claim 1, wherein the optical film, the phase difference film, or the other optical film has a relative permittivity of 2 or more and 5 or less.

7. The display device with a capacitive touch panel according to claim 1, wherein the optical film, the phase difference film, or the other optical film has a saturated water absorption of 0.01 mass % or less.

8. The display device with a capacitive touch panel according to claim 1, wherein the first conductive layer and the second conductive layer are formed by using indium tin oxide, carbon nanotubes, or silver nanowires.

9. The display device with a capacitive touch panel according to claim 1, wherein the substrate further comprises:
a hard coat layer on one side of the optical film; and
a low refractive index layer on the hard coat layer opposite the optical film, the low refractive index layer having a lower refractive index than the hard coat layer.

10. A display device with a capacitive touch panel, comprising:
a display panel;
a cover layer; and
a laminate between the display panel and the cover layer, the laminate having:
a viewing-side polarizing plate;
a display panel-side substrate;
a first conductive layer that is formed on a surface of the display panel-side substrate facing the cover layer; and
a second conductive layer that is formed on a surface of the display panel-side substrate facing the display panel, the first conductive layer, the second conductive layer, and the display panel-side substrate being positioned closer to the display panel than is the viewing-side polarizing plate, the first conductive layer being positioned closer to the cover layer than is the second conductive layer, and the first conductive layer and the second conductive layer being arranged apart from each other in a stacking direction so as to form a capacitive touch sensor.

11. The display device with a capacitive touch panel according to claim 10, wherein
the display device further comprises an optical film with a phase difference of $(2n-1)\lambda/4$, where n is a positive integer, between the cover layer and the viewing-side polarizing plate, the viewing-side polarizing plate has a polarizing film, and a slow axis of the optical film intersects a transmission axis of the polarizing film at an angle of about 45° as viewed in the stacking direction, or
the display panel-side substrate has a phase difference film for optical compensation.

12. A display device with a capacitive touch panel, comprising:
a display panel having an organic EL display panel;
a cover layer; and
a laminate between the display panel and the cover layer, the laminate having:
a circularly polarizing plate, having:
a substrate having an optical film with a phase difference of $\lambda/4$; and
a polarizing plate having a polarizing film;
a first conductive layer that is formed on a surface of the substrate facing the cover layer; and
a second conductive layer that is formed on a surface of the substrate facing the display panel, the first conductive layer, the second conductive layer, and the substrate being positioned closer to the display panel than is the polarizing plate, the first conductive layer being positioned closer to the cover layer than is the second conductive layer, and the first conductive layer and the second conductive layer being arranged apart from each other in a stacking direction so as to form a capacitive touch sensor.

13. The display device with a capacitive touch panel according to claim 12, wherein a slow axis of the optical film intersects a transmission axis of the polarizing film at an angle of about 45° as viewed in the stacking direction.

14. The display device with a capacitive touch panel according to claim 13, wherein the optical film has reverse wavelength dispersion characteristics.

15. The display device with a capacitive touch panel according to claim 12, wherein
 the circularly polarizing plate further comprises a polarizing plate-side substrate positioned between the substrate and the polarizing plate,
 the polarizing film is positioned at a surface of the polarizing plate facing the display panel,
 the polarizing plate-side substrate is bonded to a surface of the polarizing film facing the display panel,
 a slow axis of the optical film intersects a transmission axis of the polarizing film at an angle of about 75° as viewed in the stacking direction,
 the polarizing plate-side substrate has another optical film with a phase difference of λ/2, and
 a slow axis of the other optical film intersects the transmission axis of the polarizing film at an angle of about 15° as viewed in the stacking direction.

16. The display device with a capacitive touch panel according to claim 12, wherein
 the circularly polarizing plate further comprises a polarizing plate-side substrate positioned between the substrate and the polarizing plate,
 the polarizing film is positioned at a surface of the polarizing plate facing the display panel, and
 the polarizing plate-side substrate is bonded to a surface of the polarizing film facing the display panel,
 a slow axis of the optical film intersects a transmission axis of the polarizing film at an angle of about 90° as viewed in the stacking direction,
 the polarizing plate-side substrate has another optical film with a phase difference of λ/2, and
 a slow axis of the other optical film intersects the transmission axis of the polarizing film at an angle of about 22.5° as viewed in the stacking direction.

17. The display device with a capacitive touch panel according to claim 15, wherein the display device has no index matching layer.

\* \* \* \* \*